(12) United States Patent
Chen et al.

(10) Patent No.: US 10,497,656 B2
(45) Date of Patent: Dec. 3, 2019

(54) DUAL-SIDED MODULE WITH LAND-GRID ARRAY (LGA) FOOTPRINT

(71) Applicant: SKYWORKS SOLUTIONS, INC., Woburn, MA (US)

(72) Inventors: Howard E. Chen, Anaheim, CA (US); Robert Francis Darveaux, Corona Del Mar, CA (US); Anthony James Lobianco, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/884,374

(22) Filed: Jan. 30, 2018

(65) Prior Publication Data

US 2018/0240763 A1  Aug. 23, 2018

Related U.S. Application Data

(60) Provisional application No. 62/452,340, filed on Jan. 30, 2017.

(51) Int. Cl.
| | |
|---|---|
| *H01L 23/66* | (2006.01) |
| *H01L 23/00* | (2006.01) |
| *H05K 1/02* | (2006.01) |
| *H01L 23/498* | (2006.01) |
| *H01L 23/31* | (2006.01) |

(52) U.S. Cl.
CPC ........ *H01L 23/66* (2013.01); *H01L 23/49811* (2013.01); *H01L 24/11* (2013.01); *H01L 24/17* (2013.01); *H05K 1/0243* (2013.01); *H01L 23/3128* (2013.01); *H01L 2223/6677* (2013.01); *H01L 2924/15311* (2013.01); *H01L 2924/15313* (2013.01)

(58) Field of Classification Search
None
See application file for complete search history.

(56) References Cited

U.S. PATENT DOCUMENTS

2016/0035678 A1* 2/2016 Yoo ........................ H01L 23/552
257/659

* cited by examiner

*Primary Examiner* — Long Pham
(74) *Attorney, Agent, or Firm* — Chang & Hale LLP

(57) ABSTRACT

A packaged radio-frequency device is disclosed, including a packaging substrate configured to receive one or more components, the packaging substrate including a first side and a second side. The packaging substrate may include a first component mounted on the first side of the packaging substrate and a first overmold structure implemented on the first side of the packaging substrate, the first overmold structure substantially encapsulating the first component. The packaging substrate may further include a set of through-mold connections implemented on the second side of the packaging substrate, the set of through-mold connections including signal pins and ground pins, a second component mounted on the second side of the packaging substrate, the second component being located in an area of the second side configured to implement redundant ground pins and a second overmold structure substantially encapsulating one or more of the second component or the set of through-mold connections.

16 Claims, 5 Drawing Sheets

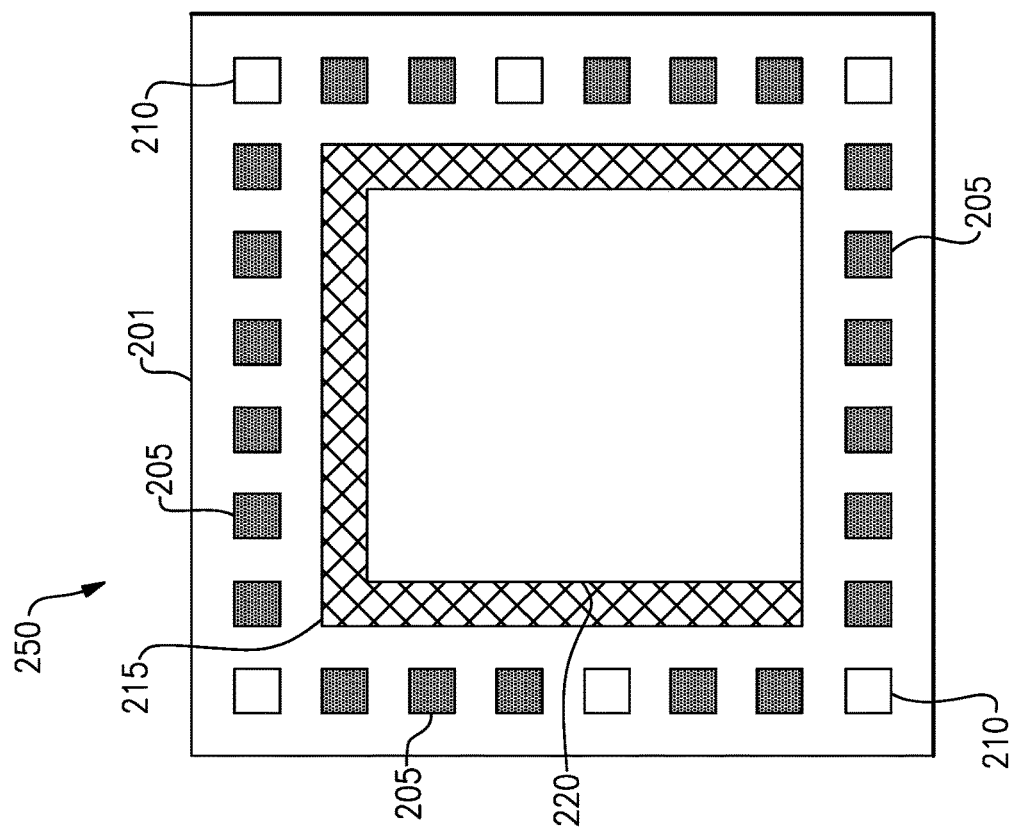
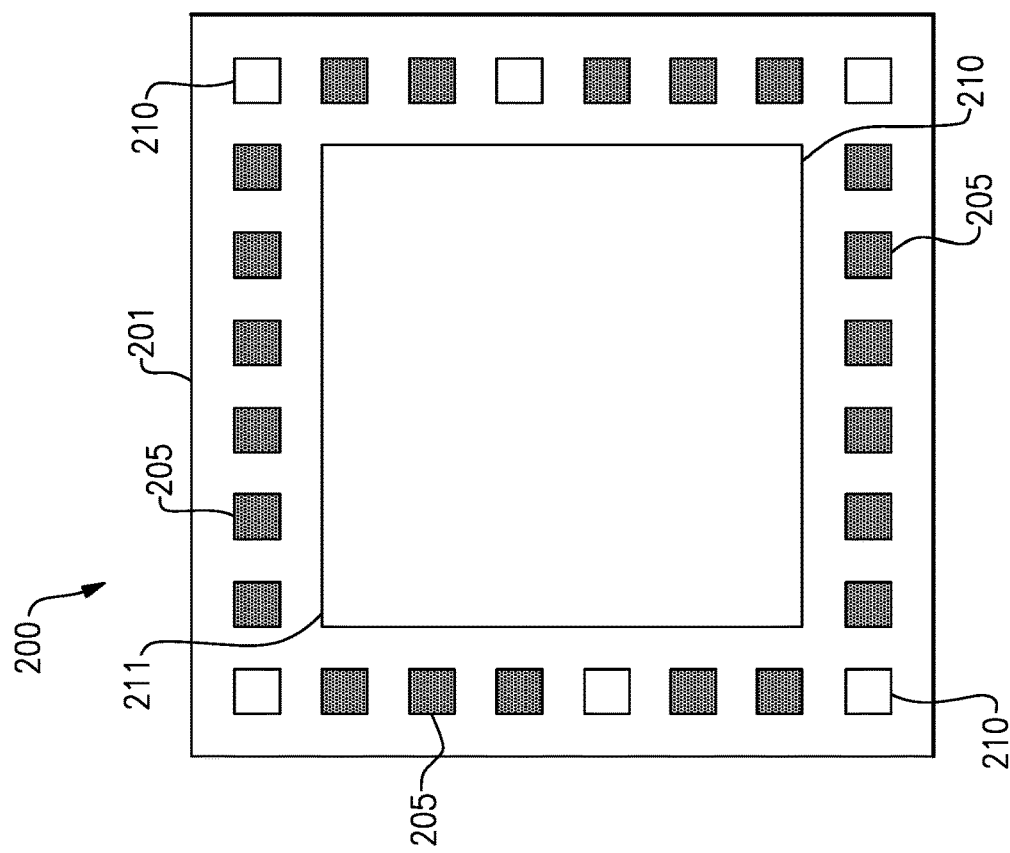
FIG.2B
FIG.2A

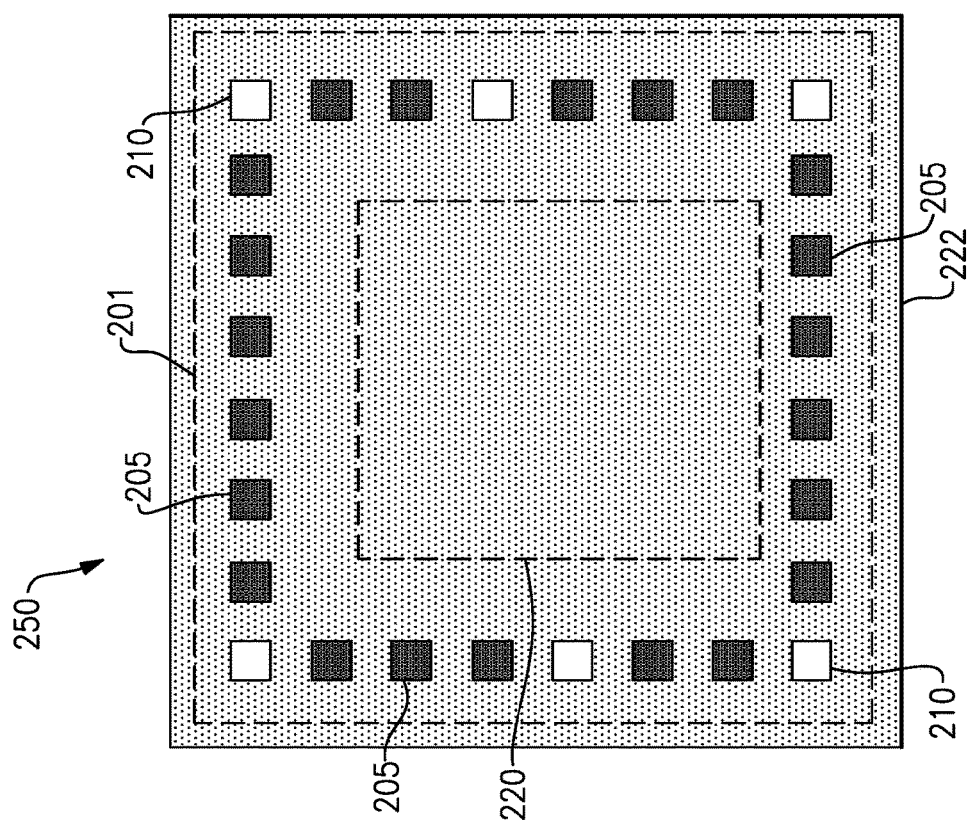
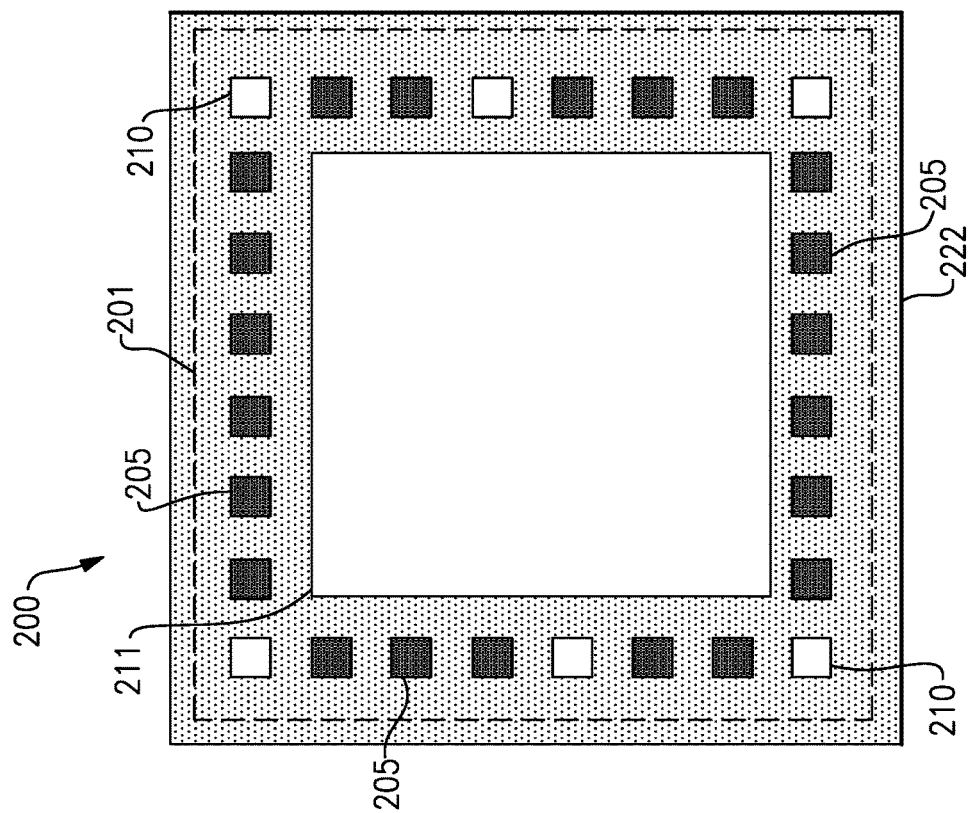

DUAL-SIDED MODULE WITH LAND-GRID ARRAY (LGA) FOOTPRINT

CROSS-REFERENCE TO RELATED APPLICATION(S)

This application claims priority to U.S. Provisional Application No. 62/452,340 filed Jan. 30, 2017, entitled DUAL-SIDED MODULE WITH LAND-GRID ARRAY (LGA) FOOTPRINT. The content of the above-referenced application is hereby expressly incorporated by reference herein in its entirety for all purposes.

BACKGROUND

Field

The present disclosure generally relates to packaging of circuit devices.

Description of the Related Art

The present disclosure relates to fabrication of packaged electronic modules such as radio-frequency (RF) modules. In radio-frequency (RF) applications, RF circuits and related devices can be implemented in a packaged module. Such a packaged module can then be mounted on a circuit board such as a phone board.

SUMMARY

In accordance with some implementations, the present disclosure relates to a radio-frequency (RF) module. The radio-frequency module includes a packaging substrate configured to receive one or more components, the packaging substrate including a first side and a second side. The packaging substrate may include a first component mounted on the first side of the packaging substrate, and a first overmold structure implemented on the first side of the packaging substrate, the first overmold structure substantially encapsulating the first component. The packaging substrate may include a set of through-mold connections implemented on the second side of the packaging substrate, the set of through-mold connections including signal pins and ground pins, and a second component mounted on the second side of the packaging substrate, the second component being located in an area of the second side configured to implement redundant ground pins. The packaging substrate may include a second overmold structure substantially encapsulating one or more of the second component or the set of through-mold connections.

In some embodiments, the first side comprises one or more shielding features. In some embodiments, the second side comprises one or more shielding features. The one or more shielding features may include one or more grounding features.

In some embodiments, the set of through-mold connections implemented on the second side of the packaging substrate defines one or more regions on the second side for implementing one or more components.

In some embodiments, the set of through-mold connections comprises a set of pillars configured to allow the packaged radio-frequency device to be mounted on a circuit board.

In some embodiments, the set of through-mold connections comprises a set of pillars configured to allow the radio-frequency module to be mounted on a circuit board.

In some embodiments, the set of through-mold connections is configured to allow the packaged radio-frequency device to be mounted on a circuit board using a land grid array configuration.

In some embodiments, the packaging substrate includes a laminate substrate. In some embodiments, the packaging substrate includes a ceramic substrate. In some embodiments, the ceramic substrate includes a low-temperature co-fired ceramic substrate. In some embodiments, the second component includes a semiconductor die.

The present disclosure also relates to a method for manufacturing packaged radio-frequency (RF) devices. The method includes providing a packaging substrate configured to receive a plurality of components, the packaging substrate including a first side and a second side, mounting a first circuit on the first side of the packaging substrate, implementing a first overmold structure on the first side of the packaging substrate, the first overmold structure substantially encapsulating the first component, mounting a second component on the second side of the packaging substrate, the second component being located in an area of the second side where redundant ground pins may be located. The method may include implementing a set of through-mold connections on the second side of the packaging substrate, the set of through-mold connections including signal pins and ground pins, forming a second overmold structure over the component and the set of through-mold connections and removing a portion of the second overmold structure.

In some embodiments, removing the portion of the second overmold structure includes exposing the set of through-mold connections. In some implementations, the method includes determining a set of through-mold connections not to implement on the second side of the packaging substrate. In some embodiments the method includes determining the set of through-mold connections not to implement based in part on the mounting of the second component.

The present disclosure also relates to a wireless device. The wireless device includes a circuit board configured to receive a plurality of packaged modules and a radio-frequency module mounted on the circuit board, the radio-frequency module including a packaging substrate configured to receive one or more components, the packaging substrate including a first side and a second side, the packaging substrate including a first component mounted on the first side of the packaging substrate, a first overmold structure implemented on the first side of the packaging substrate, the first overmold structure substantially encapsulating the first component, a set of through-mold connections implemented on the second side of the packaging substrate, the set of through-mold connections including signal pins and ground pins, a second component mounted on the second side of the packaging substrate, the second component being located in an area of the second side configured to implement redundant ground pins, and a second overmold structure substantially encapsulating one or more of the second component or the set of through-mold connections.

BRIEF DESCRIPTION OF THE DRAWINGS

FIG. 2A is a block diagram illustrating a first side of a third RF module, according to some embodiments of the present disclosure.

FIG. 2B is a block diagram illustrating a first side of a fourth RF module, according to some embodiments of the present disclosure.

FIG. 2C is a block diagram illustrating a first side of the third RF module with an overmold covering, according to some embodiments of the present disclosure.

FIG. 2D is a block diagram illustrating a first side of the fourth RF module with an overmold covering, according to some embodiments of the present disclosure.

DETAILED DESCRIPTION OF SOME EMBODIMENTS

The headings provided herein, if any, are for convenience only and do not necessarily affect the scope or meaning of the claimed invention.

The present disclosure relates to fabrication of packaged electronic modules such as radio-frequency (RF) modules. In radio-frequency (RF) applications, RF circuits and related devices can be implemented in a packaged module. Such a packaged module can then be mounted on a circuit board such as a phone board.

In some embodiments, the RF module may be a dual-sided module. The dual sided module may include a packaging substrate, one or more lower components (e.g., one or more lower components) mounted on a first side (e.g., a lower side) of the packaging substrate, and one or more components (e.g., one or more upper components) mounted on a second side (e.g., an upper side) of the packaging substrate. The labels of first side and second side are interchangeable, and in some embodiments refer to two sides of the packaging substrate with the most available area for population of components. In some embodiments, the RF module may be shielded. For example, the RF module may include various structures and/or components, such as wire-bonds, conductive layers, conductive features, etc., that may provide RF shielding for the RF module. The RF shielding may help prevent RF signals from entering the RF module (from outside the RF module) and/or may help prevent RF signals from leaving the RF module (from inside the RF module). Additional details related to dual-sided modules and/or shielding for dual-sided modules are found in, for example, U.S. patent application Ser. No. 15/724,722 entitled DUAL-SIDED RADIO-FREQUENCY PACKAGE WITH OVERMOLD STRUCTURE and filed on Oct. 4, 2017, the disclosure of which is hereby expressly incorporated by reference herein in its entirety. Additional details concerning such shielding can be found in, for example, U.S. Pat. No. 8,373,264 entitled SEMICONDUCTOR PACKAGE WITH INTEGRATED INTERFERENCE SHIELDING AND METHOD OF MANUFACTURE THEREOF which is expressly incorporated by reference in its entirety for all purposes.

Figure 1B:
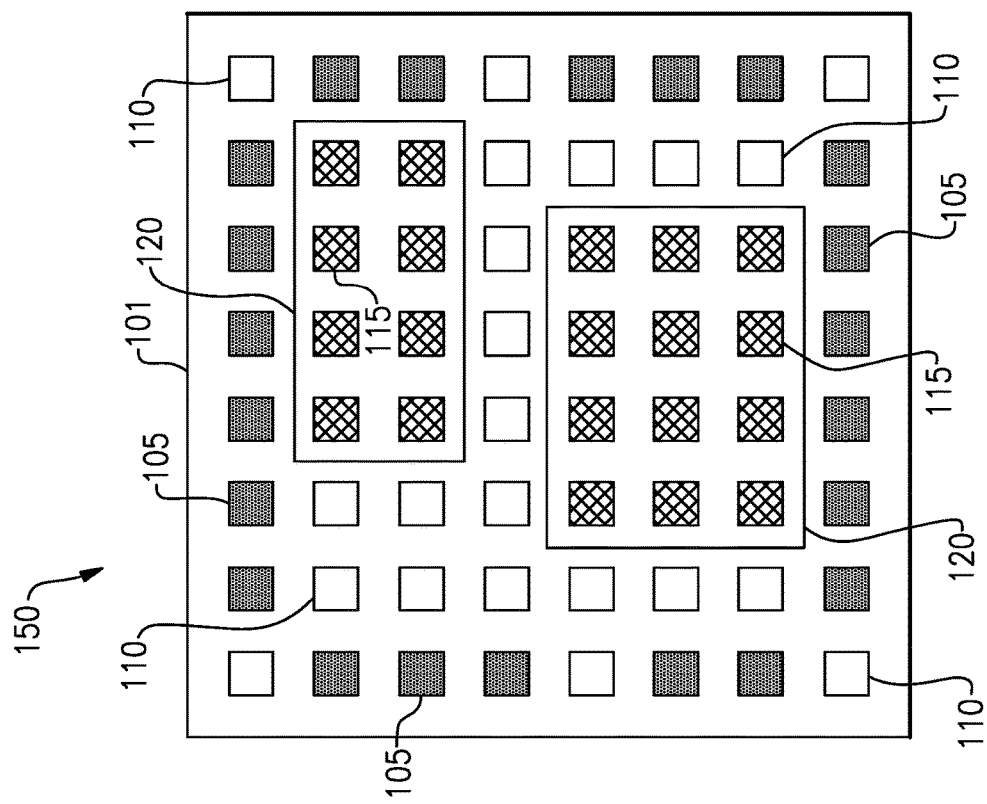
FIG. 1B is a block diagram illustrating a first side of a second RF module, according to some embodiments of the present disclosure.
Figure 1A:
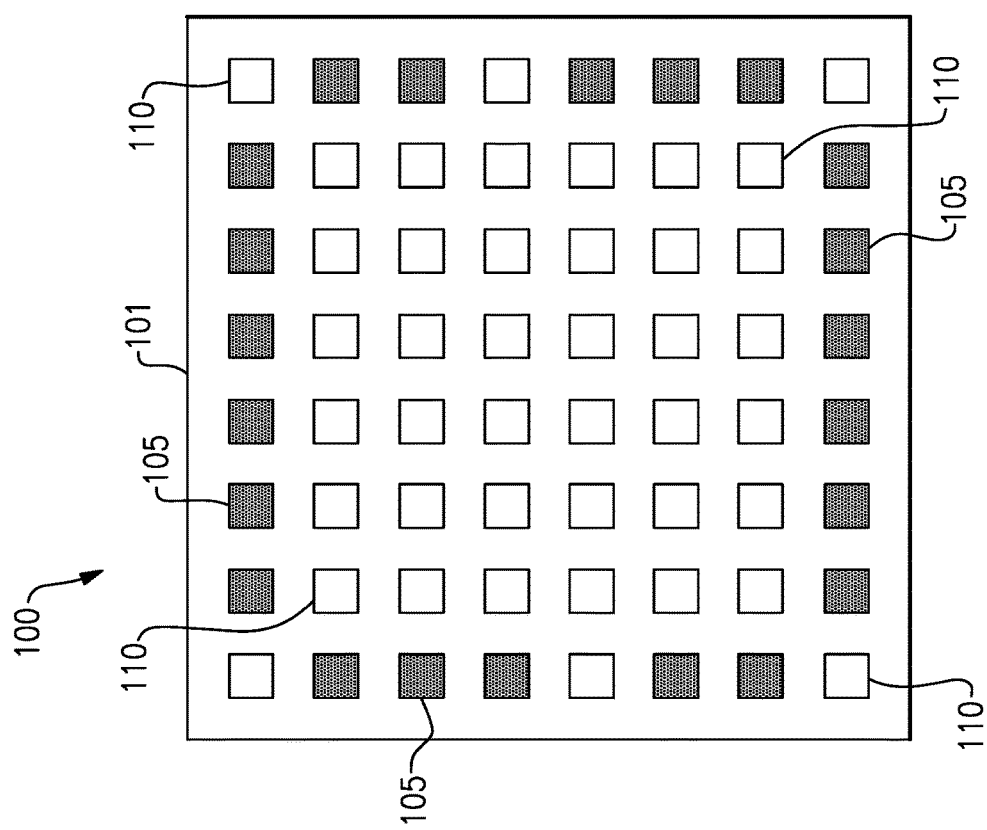
FIG. 1A is a block diagram illustrating a first side of a first RF module, according to some embodiments of the present disclosure.

FIG. 1A is a block diagram illustrating an underside of a RF module 100, according to some embodiments of the present disclosure. The RF module 100 includes a substrate 101 (e.g., a packaging substrate and a plurality of through mold connections (represented by the smaller squares within the RF module 100) formed/implemented on the substrate 101. Examples of through-mold connections include, but are not limited to solder balls, ball grid arrays (BGAs), pillars, columns, posts, pedestals, wires, pins, traces, etc.

The through-mold connections include signal traces 105 (indicated by the filled, smaller squares in the RF module 100). In one embodiment, the signal traces 105 may transmit, receive, carry, and/or communicate data/signals between components of the RF module 100 and/or between the RF module 100 an another device/component (such as a circuit board). For example, the signal traces 105 may be used to communicate data/signals between a first component on an upper side of the RF module 100 and a circuit board. In another example, the signal traces 105 may be used to communicate data/signals between a first component on an upper side of the RF module 100 and second component on the lower side of the RF module 100. In another embodiment, the signal traces 105 may couple (e.g., electrically couple) different components of the RF module 100 to each other, or may couple (e.g., electrically couple) the RF module 100 to another device/component (such as a circuit board).

The through-mold connections also include ground pins 110 (indicated by the empty, smaller squares in the RF module 100). In one embodiment, the ground pins 110 may be used to couple (e.g., electrically couple) the RF module 100 and/or components of the RF module to a ground and/or ground plane (e.g., a ground plane in a circuit board). In one embodiment, some of the ground pins 110 may be redundant. For example, a subset of the ground pins 110 may be sufficient to ground the RF module 100 and/or components of the RF module 100.

FIG. 1B is a block diagram illustrating an underside of another RF module 150, according to some embodiments of the present disclosure. The RF module 150 includes a substrate 101 (e.g., a packaging substrate and a plurality of through mold connections represented by the smaller squares within the RF module 150) formed/implemented on the substrate 101, as discussed above. The through-mold connections include signal traces 105 (indicated by the filled, smaller squares in the RF module 150), as discussed above. The through-mold connections also include ground pins 110 (indicated by the empty, smaller squares in the RF module 150), as discussed above.

As discussed above, some of the ground pins 110 may be redundant. For example, a subset of the ground pins 110 may be sufficient to ground the RF module 150 and/or components of the RF module 150. The ground pins that are redundant (e.g., not of the subset of ground pins sufficient to ground the RF module 150) may be referred to as redundant ground pins 115 (indicated by the hashed, smaller squares in the RF module 150), or non-essential ground pins 115.

In some embodiments, the redundant ground pins 115 may not be formed/implemented on the substrate 101 (because there may enough ground pins 110 to ground the RF module 110 and/or components of the RF module 150). For example, it may be determined before manufacturing RF module 150, that a subset of potential grounds pins 110 (e.g., an example of the full set shown in FIG. 1A), will provide sufficient grounding for all the components implemented on substrate 101. A component, such as a circuit, a die, a semiconductor die, etc., may be mounted, implemented, formed, etc., on an area of the packaging substrate 101 where the redundant ground pins 115 would have been located. As illustrated in FIG. 1B, instead of forming/implementing the redundant ground pins 115, components 120 (e.g., circuits, dies, etc.) may be formed in the areas of the substrate 101 where the redundant ground pins 115 would have been located. Thus, the components 120 may be located in areas of the substrate 101 where redundant ground pins 115 may be located (e.g., may have been located if the redundant ground pins 115 were formed/implemented on the substrate 101).

One having ordinary skill in the art understands that the shape, number, and/or size of the components 120 may vary in other embodiments. In one embodiment, the shape, number, and/or size of the components 120 that may be mounted, implemented, formed, etc., on the substrate 101 may be based on the size of the areas on the substrate 101 where redundant ground pins 115 may be located. For example, if there are three areas where redundant grounds pins 115 may be located, then three (or fewer) components may be mounted onto the substrate 101.

In some embodiments, a method of packaging a RF module 150 includes one or more of the following determinations or actions. For example, one side (e.g., the first or lower or under side) of a RF module 150 is determined to be designed to support I/O functionality for the RF module 150. This may include a determination of which or how many signal pins 105, and which or how many ground pins 110 (e.g., essential ground pins) to implement. In some implementations, determining how many ground pins 110 to implement includes providing one or more ground pins 110 for one or more circuit blocks of one or more components (e.g., components 120 or components on the other side of RF module 150). A method of packaging the RF module 150 may include determining optimal locations for the ground pins 110 determined to be needed to implement (e.g., essential ground pins). In some implementations, this optimal placement of ground pins 110 may include determining optimal placement of one or more components 120 on the same side of RF module 150, as the ground pins 110 and signal pins 105. In some embodiments, determining an optimal placement of one or more components 120 and optimal placement of one or more ground pins 110 is an iterative process between these two actions, to achieve the shortest possible traces between ground pins 110, signal pins 105 and I/O ports/pins of components 120. Another element of this method of packaging RF module 150 may include forming an overmold over components 120 and ground pins 110 and signal pins 105.

Figure 1D:
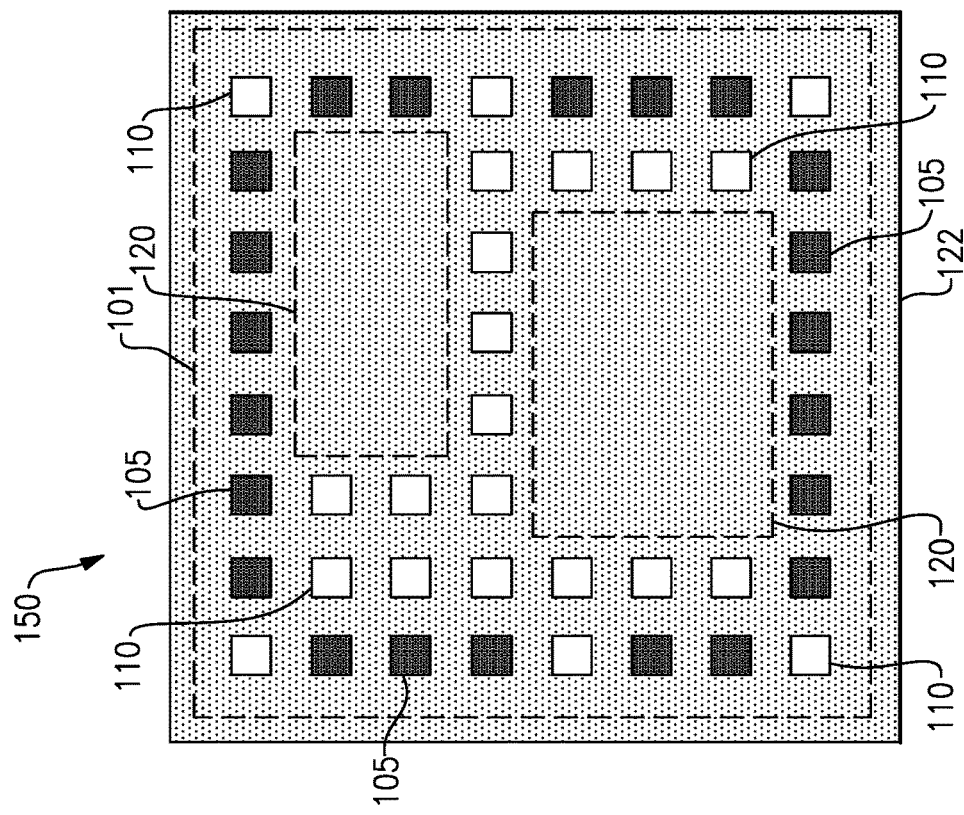
FIG. 1D is a block diagram illustrating a first side of the second RF module with an overmold covering, according to some embodiments of the present disclosure.
Figure 1C:
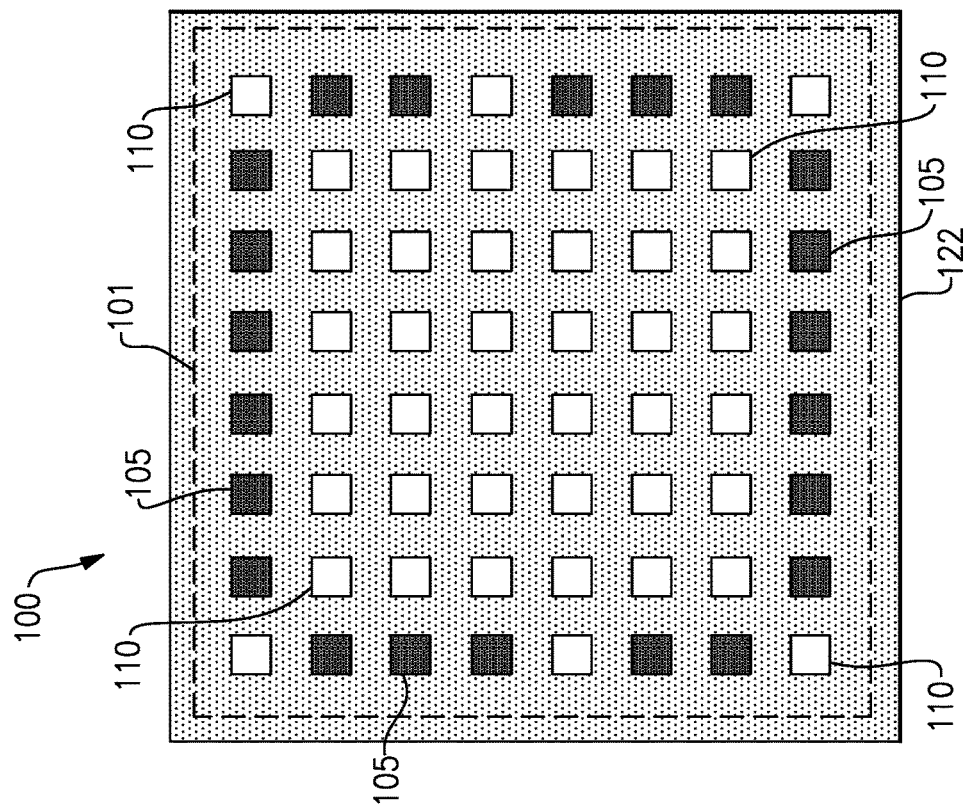
FIG. 1C is a block diagram illustrating a first side of the first RF module with an overmold covering, according to some embodiments of the present disclosure.

FIG. 1C is a block diagram illustrating an underside of RF module 100 with an overmold covering 122, according to some embodiments of the present disclosure. In one embodiment, an overmold 122 (e.g., an overmold structure, overmold material, etc.) may be formed over the components 120 and the through-mold connections (e.g., the ground pins 110, and the signal pins 105). The through-mold connections (e.g., the ground pins 110, and the signal pins 105) may be exposed through the surface of the overmold 122. This may allow the RF module 150 to form a land grid array (LGA) type/style package using the through-mold connections which may allow the RF module 150 to be mounted, installed, coupled to, etc., a circuit board that uses an LGA type/style footprint (e.g., an LGA type/style connection, interface, etc.).

FIG. 1D is a block diagram illustrating an underside of RF module 150 with an overmold covering 122, according to some embodiments of the present disclosure. As described with respect to FIG. 1C, the overmold 122 may be exposed to allow contact with ground pins 110 and signal pins 105. FIG. 1D illustrates with dotted outlines, where components 120 are located under the covering of the overmold 122, as well as packaging substrate 101. This illustrates the ability for mounting components on a side of an RF module, covering them with a protective layer (e.g., overmold 122), and still providing a compatible package for a circuit board designed to interface with an LGA package.

FIG. 2A is a block diagram illustrating an underside of a RF module 200, according to some embodiments of the present disclosure. The RF module 200 includes a substrate 201 (e.g., a packaging substrate and a plurality of through mold connections (represented by the smaller squares within the RF module 200) formed/implemented on the substrate 201. Examples of through-mold connections include, but are not limited to solder balls, ball grid arrays (BGAs), pillars, columns, posts, pedestals, wires, pins, traces, etc.

The through-mold connections include signal traces 205 (indicated by the filled, smaller squares in the RF module 200). In one embodiment, the signal traces 205 may transmit, receive, carry, and/or communicate data/signals between components of the RF module 200 and/or between the RF module 200 an another device/component (such as a circuit board). For example, the signal traces 205 may be used to communicate data/signals between a first component on an upper side of the RF module 200 and a circuit board. In another example, the signal traces 205 may be used to communicate data/signals between a first component on an upper side of the RF module 200 and second component on the lower side of the RF module 200. In another embodiment, the signal traces 205 may couple (e.g., electrically couple) different components of the RF module 200 to each other, or may couple (e.g., electrically couple) the RF module 200 another device/component (such as a circuit board).

The through-mold connections also include ground pins 210 (indicated by the empty, smaller squares in the RF module 200). In one embodiment, the ground pins 210 may be used to couple (e.g., electrically couple) the RF module 200 and/or components of the RF module to a ground and/or ground plane (e.g., a ground plane in a circuit board). The RF module 200 also includes a grounding pad 211. The grounding pad 211 may be a larger sized pin/trace (e.g., a pad, a metallic surface, etc.) that may be used to couple (e.g., electrically couple) the RF module 200 and/or components of the RF module to a ground and/or ground plane (e.g., a ground plane in a circuit board). In one embodiment, the grounding pad 211 (or portions of the ground pad 211) may be redundant. For example, a subset of the ground pins 210 may be sufficient to ground the RF module 200 and/or components of the RF module 200 without using the ground pad 211 (or portions of the ground pad 211).

FIG. 2B is a block diagram illustrating an underside of a RF module 250, according to some embodiments of the present disclosure. The RF module 250 includes a substrate 201 (e.g., a packaging substrate and a plurality of through mold connections (represented by the smaller squares within the RF module 200) formed/implemented on the substrate 201, as discussed above. The through-mold connections include signal traces 205 (indicated by the filled, smaller squares in the RF module 200), as discussed above. The through-mold connections also include ground pins 210 (indicated by the empty, smaller squares in the RF module 200), as discussed above.

As discussed above, the grounding pad 211 (or portions of the ground pad 211) may be redundant. For example, a subset of the ground pins 210 may be sufficient to ground the RF module 200 and/or components of the RF module 200 without using the ground pad 211 (or portions of the ground pad 211). The ground 211 may be referred to as redundant ground pad 215 (indicated by the largest, hashed square in the RF module 250).

In one embodiment, the redundant ground pad 215 may not be formed/implemented on the substrate 201 (because there may enough ground pins 210 to ground the RF module 210 and/or components of the RF module 200). A component, such as a circuit, a die, a semiconductor die, etc., may be mounted, implemented, formed, etc., on an area of the packaging substrate 201 where the redundant ground pad 215 (or redundant portions of the ground pad) would have been located. As illustrated in FIG. 2B, instead of forming/implementing the redundant ground pad 215, components 220 (e.g., circuits, dies, etc.) may be formed in the areas of the substrate 201 where the redundant ground pad 215 (or redundant portions of the ground pad) would have been located. Thus, the components 220 may be located in areas of the substrate 201 where the redundant ground pad 215 (or redundant portions of the ground pad) may be located (e.g., may have been located if the redundant ground pad 215 or redundant portions of the ground pad were formed/implemented on the substrate 201.

One having ordinary skill in the art understands that the shape, number, and/or size of the components 220 may vary in other embodiments. In one embodiment, the shape, number, and/or size of the components 220 that may be mounted, implemented, formed, etc., on the substrate 201 may be based on the size of the areas on the substrate 201 where the redundant ground pad 215 (or redundant portions of the ground pad) may be located.

FIG. 2C is a block diagram illustrating an underside of RF module 200 with an overmold covering 222, according to some embodiments of the present disclosure. In one embodiment, an overmold 222 (e.g., an overmold structure, overmold material, etc.) may be formed over the components 220 and the through-mold connections (e.g., the ground pins 210, and the signal pins 215). The through-mold connections (e.g., the ground pins 210, and the signal pins 215) may be exposed through the surface of the overmold 222. This may allow the RF module 250 to form a land grid array (LGA) type/style package using the through-mold connections which may allow the RF module 250 to be mounted, installed, coupled to, etc., a circuit board that uses an LGA type/style footprint (e.g., an LGA type/style connection, interface, etc.).

FIG. 2D is a block diagram illustrating an underside of RF module 250 with an overmold covering 222, according to some embodiments of the present disclosure. As described with respect to FIG. 2C, the overmold 222 may be exposed to allow contact with ground pins 110 and signal pins 105. FIG. 2D illustrates with dotted outlines, where component(s) 220 are located under the covering of the overmold 222, as well as packaging substrate 201. This illustrates the ability for mounting components on a side of an RF module, covering them with a protective layer (e.g., overmold 222), and still providing a compatible package for a circuit board designed to interface with an LGA package.

In some embodiments, a packaged module having one or more features can be fabricated utilizing, for example, some or all of the manufacturing techniques described in U.S. Patent Application Publication No. 2016/0099192 entitled DUAL-SIDED RADIO-FREQUENCY PACKAGE HAVING BALL GRID ARRAY, incorporated by reference herein in its entirety.

Figure 3:
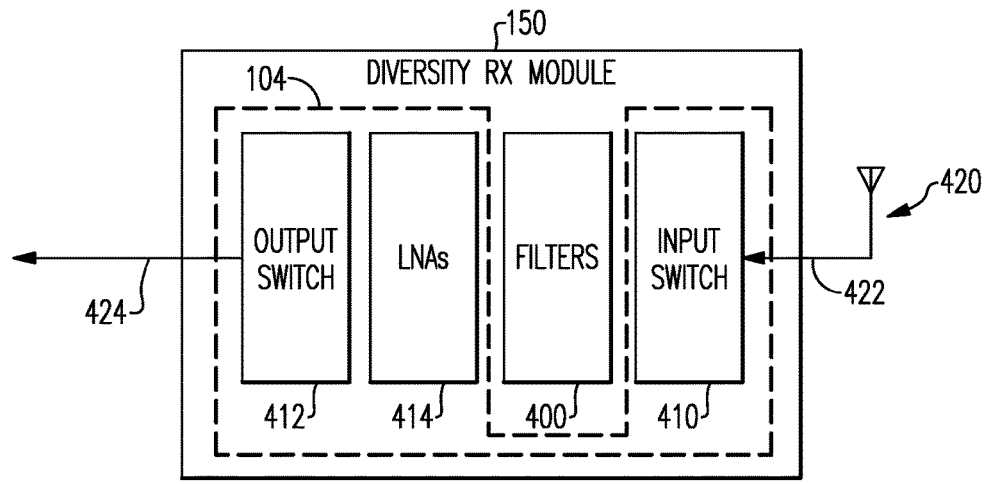
FIG. 3 shows an example of a radio-frequency (RF) module having one or more features as described herein.
Figure 4:
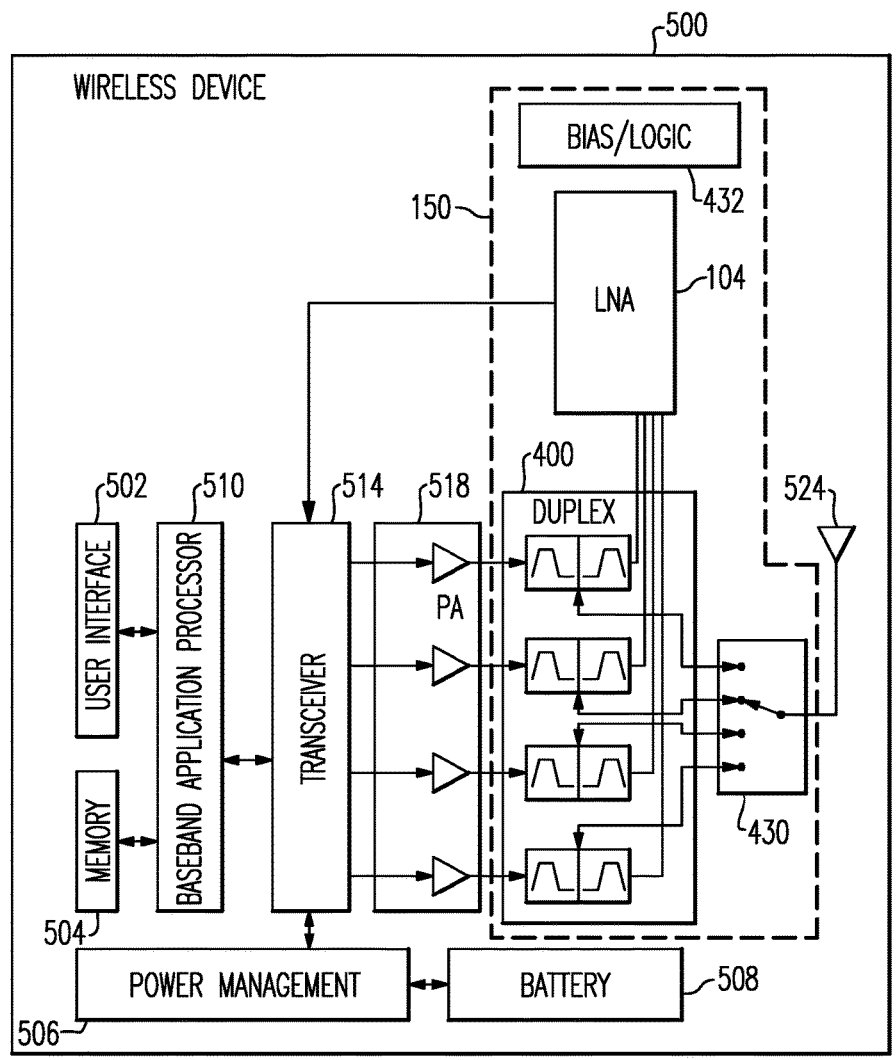
FIG. 4 shows an example of a wireless device having one or more features as described herein.

In some implementations, a packaged module having one or more features as described herein can be utilized in various products. For example, FIGS. 3 and 4 show examples of how a packaged module having one or more features as described herein can be configured for use in a wireless device, and/or be implemented in a wireless device. FIG. 3 shows that in some embodiments, a packaged module having one or more features as described herein can be implemented as a diversity receive (RX) module 150. In some applications, such a module can be implemented relatively close to a diversity antenna 420 so as to minimize or reduce losses and/or noise in a signal path 422.

The diversity RX module 100 in the example of FIG. 3 can be configured such that switches 410 and 412, as well as LNAs 414, are implemented in a semiconductor die (depicted as 104) that is mounted underneath a packaging substrate. One or more filters 400 can be mounted on such a packaging substrate as described herein.

As further shown in FIG. 3, RX signals processed by the diversity RX module 150 can be routed to a transceiver through a signal path 424. In wireless applications where the signal path 424 is relatively long and lossy, the foregoing implementation of the diversity RX module 150 close to the antenna 420 can provide a number of desirable features.

It will be understood that one or more features of the present disclosure can also be implemented in packaged modules having functionalities different than that of the diversity receive example of FIG. 3. For example, for any packaged BGA-based module where selective isolation (e.g., signal isolation) is desired on the underside, one or more features as described herein can be implemented.

FIG. 4 shows that in some embodiment a packaged module having one or more features as described herein can be implemented in a wireless device 500. For example, an LNA or LNA-related module 150 can be implemented as a packaged module as described herein, and such a module can be utilized with a main antenna 524.

The example LNA module 150 of FIG. 4 can include, for example, one or more LNAs 104, a bias/logic circuit 432, and a band-selection switch 430. Some or all of such circuits can be implemented in a semiconductor die that is mounted under a packaging substrate of the LNA module 150. In such an LNA module, some or all of duplexers 400 can be mounted on the packaging substrate so as to form a packaged module having one or more features as described herein.

FIG. 4 further depicts various features associated with the example wireless device 500. Although not specifically shown in FIG. 4, a diversity RX module 150 of FIG. 3 can be included in the wireless device 500 with the LNA module 150, in place of the LNA module 150, or any combination thereof. It will also be understood that a packaged module having one or more features as described herein can be implemented in the wireless device 500 as a non-LNA module.

In the example wireless device 500, a power amplifier (PA) circuit 518 having a plurality of PAs can provide an amplified RF signal to a switch 430 (via duplexers 400), and the switch 430 can route the amplified RF signal to an antenna 524. The PA circuit 518 can receive an unamplified RF signal from a transceiver 514 that can be configured and operated in known manners.

The transceiver 514 can also be configured to process received signals. Such received signals can be routed to the LNA 104 from the antenna 524, through the duplexers 400. Various operations of the LNA 104 can be facilitated by the bias/logic circuit 432.

The transceiver 514 is shown to interact with a baseband sub-system 510 that is configured to provide conversion between data and/or voice signals suitable for a user and RF signals suitable for the transceiver 514. The transceiver 514 is also shown to be connected to a power management component 506 that is configured to manage power for the operation of the wireless device 500. Such a power management component can also control operations of the baseband sub-system 510.

The baseband sub-system 510 is shown to be connected to a user interface 502 to facilitate various input and output of voice and/or data provided to and received from the user. The baseband sub-system 510 can also be connected to a memory 504 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

In various examples described herein, references are made to isolation for an underside part of a packaged module, isolation between two or more underside parts of a packaged module, etc. For the purpose of description, it will be understood that such an isolation can include isolation involving electromagnetic signal (e.g., RF signal being processed), electromagnetic noise, or any combination thereof. For a given part or region of a packaged module, such an isolation can reduce or eliminate impact of signal and/or noise resulting from another part/region, reduce or eliminate impact of signal and/or noise on another part/region if the signal and/or noise results from the given part, or any combination thereof. For the purpose of description, it will be understood that such other part/region can be within the packaged module or external to the packaged module.

General Comments

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) module comprising:
a packaging substrate configured to receive one or more components, the packaging substrate including a first side and a second side;
a first component mounted on the first side of the packaging substrate;
a first overmold structure implemented on the first side of the packaging substrate, the first overmold structure substantially encapsulating the first component;
a set of through-mold connections implemented on the second side of the packaging substrate, the set of through-mold connections including signal pins and ground pins;
a second component mounted on the second side of the packaging substrate, the second component being located in an area of the second side configured to implement redundant ground pins; and
a second overmold structure substantially encapsulating one or more of the second component or the set of through-mold connections.

2. The radio-frequency module of claim 1 wherein the first side includes one or more shielding features.

3. The radio-frequency module of claim 2 wherein the one or more shielding features include one or more grounding features.

4. The radio-frequency module of claim 1 wherein the second side includes one or more shielding features.

5. The radio-frequency module of claim 4 wherein the one or more shielding features include one or more grounding features.

6. The radio-frequency module of claim 1 wherein the set of through-mold connections implemented on the second side of the packaging substrate defines one or more regions on the second side for implementing one or more components.

7. The radio-frequency module of claim 1 wherein the set of through-mold connections includes a set of pillars configured to allow the packaged radio-frequency device to be mounted on a circuit board.

8. The radio-frequency module of claim 1 wherein the set of through-mold connections includes a set of pillars configured to allow the radio-frequency module to be mounted on a circuit board.

9. The radio-frequency module of claim 8 wherein the set of through-mold connections is configured to allow the packaged radio-frequency device to be mounted on a circuit board using a land grid array configuration.

10. The radio-frequency module of claim 1 wherein the packaging substrate includes a laminate substrate.

11. The radio-frequency module of claim 1 wherein the packaging substrate includes a ceramic substrate.

12. The radio-frequency module of claim 11 wherein the ceramic substrate includes a low-temperature co-fired ceramic substrate.

13. The radio-frequency module of claim 1 wherein the second component includes a semiconductor die.

14. A wireless device comprising:
a circuit board configured to receive a plurality of packaged modules; and
a radio-frequency module mounted on the circuit board, the radio-frequency module including a packaging substrate configured to receive one or more components, the packaging substrate including a first side and a second side, the packaging substrate including a first component mounted on the first side of the packaging substrate, a first overmold structure implemented on the first side of the packaging substrate, the first overmold structure substantially encapsulating the first component, a set of through-mold connections implemented on the second side of the packaging substrate, the set of through-mold connections including signal pins and ground pins, a second component mounted on the second side of the packaging substrate, the second component being located in an area of the second side configured to implement redundant ground pins, and a second overmold structure substantially encapsulating one or more of the second component or the set of through-mold connections.

15. The wireless device of claim 14 wherein the packaging substrate includes a laminate substrate.

16. The wireless device of claim 14 wherein the packaging substrate includes a ceramic substrate.

* * * * *